(12) United States Patent
Herrell

(10) Patent No.: US 6,891,731 B1
(45) Date of Patent: May 10, 2005

(54) CROSSTALK CANCELLATION FOR INTEGRATED CIRCUIT PACKAGE CONFIGURATION

(75) Inventor: Dennis James Herrell, Marble Falls, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/431,640

(22) Filed: Nov. 1, 1999

(51) Int. Cl.[7] .............................. H05K 7/02; H05K 7/06; H05K 7/08; H05K 7/10

(52) U.S. Cl. ..................... 361/777; 361/760; 361/761; 361/764; 361/778; 361/780; 361/794; 340/310.07

(58) Field of Search ........................... 361/760–761, 361/764, 777, 778, 780, 794, 836, 814; 340/310.07, 646; 336/200, 107; 333/1, 4, 25, 26; 174/261

(56) References Cited

U.S. PATENT DOCUMENTS

| | | | | |
|---|---|---|---|---|
| 4,814,963 A | * | 3/1989 | Petersen ...................... 307/82 |
| 4,815,127 A | * | 3/1989 | Sato et al. ................... 379/417 |
| 4,847,986 A | * | 7/1989 | Meinel ......................... 29/606 |
| 5,475,643 A | | 12/1995 | Ohta ............................ 365/206 |
| 5,547,405 A | | 8/1996 | Pinney et al. ................. 439/894 |
| 5,679,027 A | | 10/1997 | Smith ........................... 439/676 |
| 6,057,743 A | * | 5/2000 | Aekins .......................... 333/1 |
| 6,107,578 A | * | 8/2000 | Hashim ......................... 174/250 |
| 6,262,487 B1 | * | 7/2001 | Igarashi et al. ............. 257/758 |
| 6,356,162 B1 | * | 3/2002 | DeFlandre et al. ............ 333/4 |
| 6,385,315 B1 | * | 5/2002 | Viadella et al. ............. 379/327 |
| 6,464,529 B1 | * | 10/2002 | Jensen et al. ............... 439/405 |

* cited by examiner

*Primary Examiner*—Amir Zarabian
*Assistant Examiner*—Thanh Y. Tran
(74) *Attorney, Agent, or Firm*—Zagorin O'Brien Graham LLP (57) ABSTRACT

A technique has been developed whereby crosstalk induced in a first electrical connection by current flow at an adjacent second electrical connection is at least partially cancelled by an opposing crosstalk signal induced at an inductive coupling between electrical traces extending from or toward the first and second electrical connections, respectively. Crosstalk cancellation is provided by orienting the electrical traces such that current flow through the second electrical connection and respective electrical trace induces an opposing crosstalk signal at the inductive coupling. In some configurations, an inductive coupling between electrical traces includes essentially parallel portions of the traces and an aperture in a voltage plane. In some configurations, cancellation of crosstalk induced by multiple adjacent electrical connection is provided. Crosstalk inducing electrical connections include pins, solder bumps, leads, wires, edge connectors, etc. In various configurations, crosstalk cancellation is provided on a board, on a semiconductor package, or on a semiconductor integrated circuit. The crosstalk inducing electrical connections may be integral with the board, package or integrated circuit or may be mated therewith.

22 Claims, 7 Drawing Sheets

CROSSTALK CANCELLATION FOR INTEGRATED CIRCUIT PACKAGE CONFIGURATION

BACKGROUND OF THE INVENTION

1. Field of the Invention

The invention relates to maintaining signal integrity in electrical assemblies, and more particularly to a crosstalk cancellation technique suitable for integrated circuit packaging configurations.

2. Description of the Related Art

As semiconductor packaging densities increase, crosstalk-between adjacent signal paths becomes an important noise factor that can limit performance of packaged integrated circuits. In particular, as high performance integrated circuits demand larger currents at higher frequencies with lower power supply voltages, inductively coupled crosstalk between adjacent signal paths (e.g., between pins or solder balls) may be sufficient to cause logic errors or necessitate noise tolerant circuit techniques. Accordingly, techniques are desired whereby the effects of crosstalk between adjacent signal paths, e.g., between adjacent signal paths in a Pin Grid Array (PGA), Ball Grid Array (BGA), etc., may be reduced.

One commonly used technique for canceling crosstalk in data connectors includes use of antiphase signal pairs and the cancellation of a primary crosstalk signal coupled from a first signal path of the pair using an antiphase crosstalk signal coupled from the second signal path of the pair. U.S. Pat. No. 5,679,027 describes one such technique applied to an RJ45 connecting system of plugs and jacks by exploiting capacitive coupling of conductors. U.S. Pat. No. 5,547,405 a similar approach to suppression of crosstalk in a telecommunications connector. Such techniques have also been employed in integrated circuit signal line systems such as differential bit line pairs of a semiconductor memory as shown in U.S. Pat. No. 5,475,643.

However, unlike telecommunications connectors and differential bit-line circuit designs, differential signal pairs are typically not available in semiconductor packaging configurations. As a result, crosstalk suppression techniques relying on equal and opposing coupling of antiphase voltages onto a signal line are inapposite. Furthermore, in many high performance packaged integrated circuit applications, inductively coupled crosstalk is dominant. Accordingly, other techniques are needed to address crosstalk issues presented by high-density semiconductor packaging technologies.

SUMMARY OF THE INVENTION

A technique has been developed whereby crosstalk induced in a first electrical connection by current flow at an adjacent second electrical connection is at least partially cancelled by an opposing crosstalk signal induced at an inductive coupling between electrical traces extending from or toward the first and second electrical connections, respectively. Crosstalk cancellation is provided by orienting the electrical traces such that current flow through the second electrical connection and respective electrical trace induces an opposing crosstalk signal at the inductive coupling. In some configurations, an inductive coupling between electrical traces includes essentially parallel portions of the traces and an aperture in a voltage plane.

Configurations are described wherein cancellation of crosstalk induced by multiple adjacent electrical connection is provided. In various configurations, crosstalk inducing electrical connections include pins, solder bumps, leads, wires, edge connectors, etc. In various configurations, crosstalk cancellation is provided on a board, on a semiconductor package, or on a semiconductor integrated circuit. The crosstalk inducing electrical connections may be integral with the board, package or integrated circuit or may be mated therewith. Accordingly, a variety of configurations are envisioned including manufacturing precursors with and without the crosstalk inducing electrical connections.

In one embodiment in accordance with the present invention, an electrical assembly includes traces extending toward respective off-assembly connections. Integrated transformer structures are defined along the traces to induce compensating crosstalk signals having opposing polarity to initial crosstalk signals associated with mutual coupling between adjacent of the off-assembly connections. In some realizations, one or more of the integrated transformer structures include an aperture in a voltage plane of the electrical assembly and essentially parallel portions of corresponding pairs of the traces. The essentially parallel portions traverse, or pass over, the aperture. In various realizations, the electrical assembly includes an integrated circuit chip, a chip carrier or package, or a board or card and the off-assembly connections include pins, solder joints, leads, or wires.

In another embodiment in accordance with the present invention, a crosstalk compensation circuit for offsetting an original crosstalk signal induced at a first off-assembly connection by one or more signals on one or more adjacent off-assembly connections includes electrical traces respectively coupled to the first and adjacent connections. The electrical traces traverse apertures defined in one or more voltage planes of the assembly to inductively couple compensating crosstalk signals having opposing polarity to the original crosstalk signal.

In yet another embodiment in accordance with the present invention, a method of canceling crosstalk introduced at a first electrical connection to a packaged integrated circuit by signals on an adjacent one or more electrical connections thereto includes defining a first signal trace from the first electrical connection and respective; second signal traces from the adjacent electrical connections, and defining transformer structures. The transformer structures inductively couple respective of the second signal traces to the first signal trace and are matched to induce signals substantially canceling the crosstalk introduced at the first electrical connection.

BRIEF DESCRIPTION OF THE DRAWINGS

The present invention may be better understood, and its numerous objects, features, and advantages made apparent to those skilled in the art by referencing the accompanying drawings.

FIG. 6 overlays the uncancelled signal of FIG. 4 and the cancelled signal of

FIG. 5 to emphasize the efficacy of the crosstalk cancellation technique.

The use of the same reference symbols in different drawings indicates similar or identical items.

DESCRIPTION OF THE PREFERRED EMBODIMENT(S)

Figure 1:
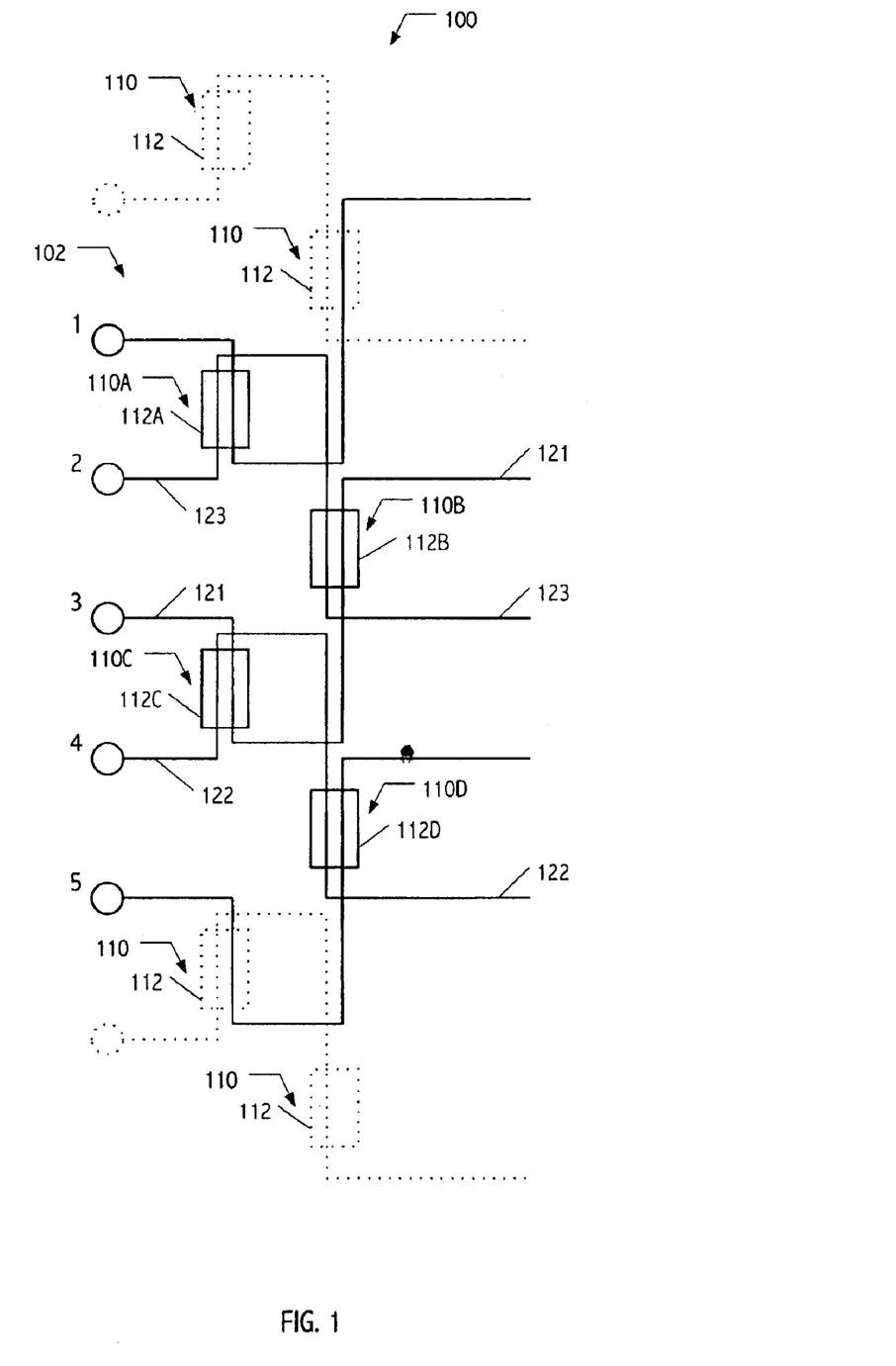
FIG. 1 depicts a crosstalk cancellation configuration in accordance with an embodiment of the present invention wherein cancellation is provided for crosstalk signals induced at a given electrical connection by two immediately adjacent electrical connections.

FIG. 1 illustrates a crosstalk cancellation configuration in accordance with one embodiment of the present invention, wherein cancellation is provided for crosstalk signals induced at a given electrical connection by two immediately adjacent electrical connections. Electrical connections 1, 2, 3, 4, and 5 are illustrative of any form of electrical connection at which a crosstalk signal may be induced by current flow in a neighboring electrical connection. For example, in one illustrative exploitation, crosstalk cancellation configuration 100 is disposed on an integrated circuit package and electrical connections 1–5 include pins, leads, solder balls, or other electrical connections off the integrated circuit package. Electrical connections 1–5 may connect the integrated circuit package to a higher level package such as a board or card, or may connect the integrated circuit package to a lower level package or article such as an integrated circuit die.

Operation of crosstalk cancellation configuration 100 is now described in the context of a subset of electrical connections and associated traces illustrated in FIG. 1. Nonetheless, based on the description herein, persons of ordinary skill in the art will appreciate application of the techniques to the remaining electrical connections and associated traces. Furthermore, although particular types of electrical connections and particular electrical assembly configurations are described, such description is for illustration of the principles of the invention only and the illustrative electrical connection types and electrical assembly configurations shall not be taken as limiting. Indeed, based on the description herein, persons of ordinary skill in the art will appreciate applications to a variety of electrical assemblies, including but not limited to packaged integrated circuit applications.

Referring then to FIG. 1, crosstalk induced at electrical connection 3 by current flowing through adjacent electrical connection 2 and 4 is at least partially cancelled using integrated transformer structures 110B and 110C. In particular, because of the orientation of trace 123 (through which connection 2 currents flow) with respect to trace 121 (through which connection 3 currents flow), the connection 2 related component of crosstalk inductively coupled into trace 121 at connection 3 is largely cancelled by opposing crosstalk inductively coupled into trace 121 at integrated transformer structure 110B. Similarly, because of the orientation of trace 122 (through which connection 4 currents flow) with respect to trace 121 (through which connection 3 currents flow), the connection 4 related component of crosstalk inductively coupled into trace 121 at connection 3 is largely cancelled by opposing crosstalk inductively coupled into trace 121 at integrated transformer structure 10C.

Of course, in the illustrated configuration, crosstalk is coupled from connection 3 into connections 2 and 4 as well as vice versa. Therefore, of note, integrated transformer structure 110B also provides crosstalk cancellation with respect to currents induced at electrical connection 2 by current flow through electrical connection 3 and integrated transformer structure 110C also provides crosstalk cancellation with respect to currents induced at electrical connection 4 by current flow through electrical connection 3. In the same manner, integrated transformer structure 110A provides crosstalk cancellation for currents induced between electrical connections 1 and 2 and integrated transformer structure 110D provides cancellation for crosstalk induced between electrical connections 4 and 5. Additional integrated transformer structures 110 illustrate application of the crosstalk cancellation technique to additional electrical connections.

Figure 1A:
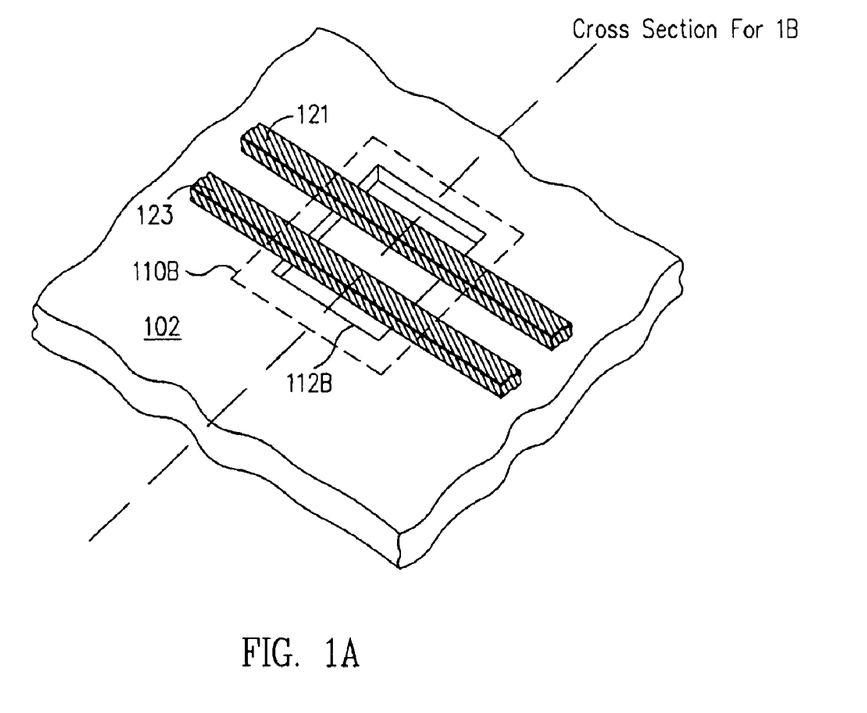
FIG. 1A depicts a perspective view of the crosstalk cancellation configuration illustrated in FIG. 1.
Figure 1B:
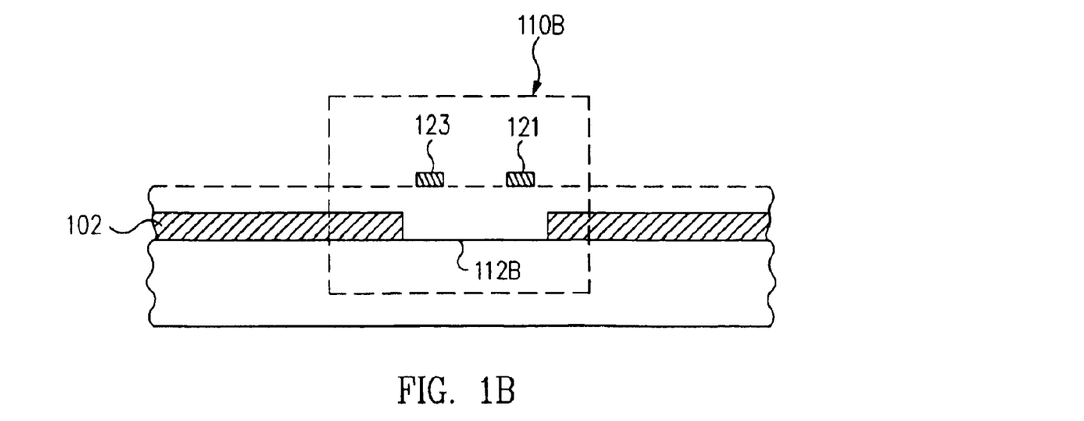
FIG. 1B depicts a perspective view of the crosstalk cancellation configuration illustrated in FIG. 1.

Although the design of transformer structures suitable to a given electrical assembly may vary depending on the characteristics or design of a particular electrical assembly, one advantageous configuration, illustrated in FIG. 1. FIG. 1A, and FIG. 1B is particularly suitable for definition on a planar electrical assembly (e.g., on a board, card, package, or integrated circuit chip). In such configurations, a voltage plane (e.g., voltage plane 102) is generally employed to reduce inductive coupling between traces 10, 20, 30, 40, and 50 on the electrical assembly. In one realization, apertures 112, 112A, 112B, 112C, 112D are defined in the voltage plane to provide the integrated transformer structures 110, 110A, 110B, 110C, and 110D. By orienting corresponding ones of the electrical traces (e.g., electrical traces 121, 122, 123, etc.) to traverse the apertures such that the relative direction of current flows therethrough opposes that through neighboring ones of the electrical connections, compensating and opposing crosstalk signals may be induced at the integrated transformer structures to provide crosstalk cancellation. In some configurations, electrical traces (e.g., 121, 122, 123, etc.) may be defined over (or under) an opening in the voltage plane below (or above). In other configurations, the electrical traces may be defined coplanar with the voltage plane and simply traverse in apertures defined therein. In such configurations, electrical traces and voltage planes may be formed using any suitable conventional process. Materials (such as metals, doped poly-silicon, etc.) suitable for a particular electrical assembly will be appreciated by persons of ordinary skill in the art.

In general, individual integrated transformer structures should be positioned as close as possible to corresponding electrical connections. Typically, electrical distances between a crosstalk inducing feature (e.g., a pair of pins or off-assembly electrical connections) and a corresponding transformer structure will be much less than a signal rise time. For example, in one realization of an electrical assembly in accordance with the present invention operating with typical off-assembly signal pulses having a pulse width of 4 ns and a rise time of 1 ns (e.g., an exemplary packaged microprocessor with a off-package 250 MHz bus interface), transformer structures would appropriately be placed within 250 ps of off-package pins. Persons of ordinary skill in the art will appreciate suitable physical distances based on the description herein and based on particular impedance characteristics of a given implementation. Nonetheless, given typical impedance characteristics, a physical distance of perhaps half an inch may correspond to a 250 ps delay. In general, the mutual inductance afforded by a crosstalk canceling transformer structure should be of roughly the same magnitude as that of the corresponding crosstalk inducing electrical connections. For example, given a mutual inductance of 2 nH between a pair of electrical connections, the corresponding crosstalk canceling transformer structure should provide approximately 1–4 nH of compensating mutual inductance.

Although FIG. 1 illustrates a suitable configuration for crosstalk cancellation in a array of electrical connections, e.g., a linear array, wherein the dominant crosstalk is associated with nearest neighboring electrical connections in the linear array, persons of ordinary skill in the art will appreciate extensions of the crosstalk cancellation technique to arrays of differing geometries (e.g., to two dimensional arrays), to array geometries with larger numbers of nearest neighbors, and to configurations wherein crosstalk signals may be induced at a given electrical connection by current flows through electrical connections beyond its nearest neighbors. In such configurations, additional stages of transformer structures may be defined, though with some increase in the complexity of trace routings.

Figure 2:
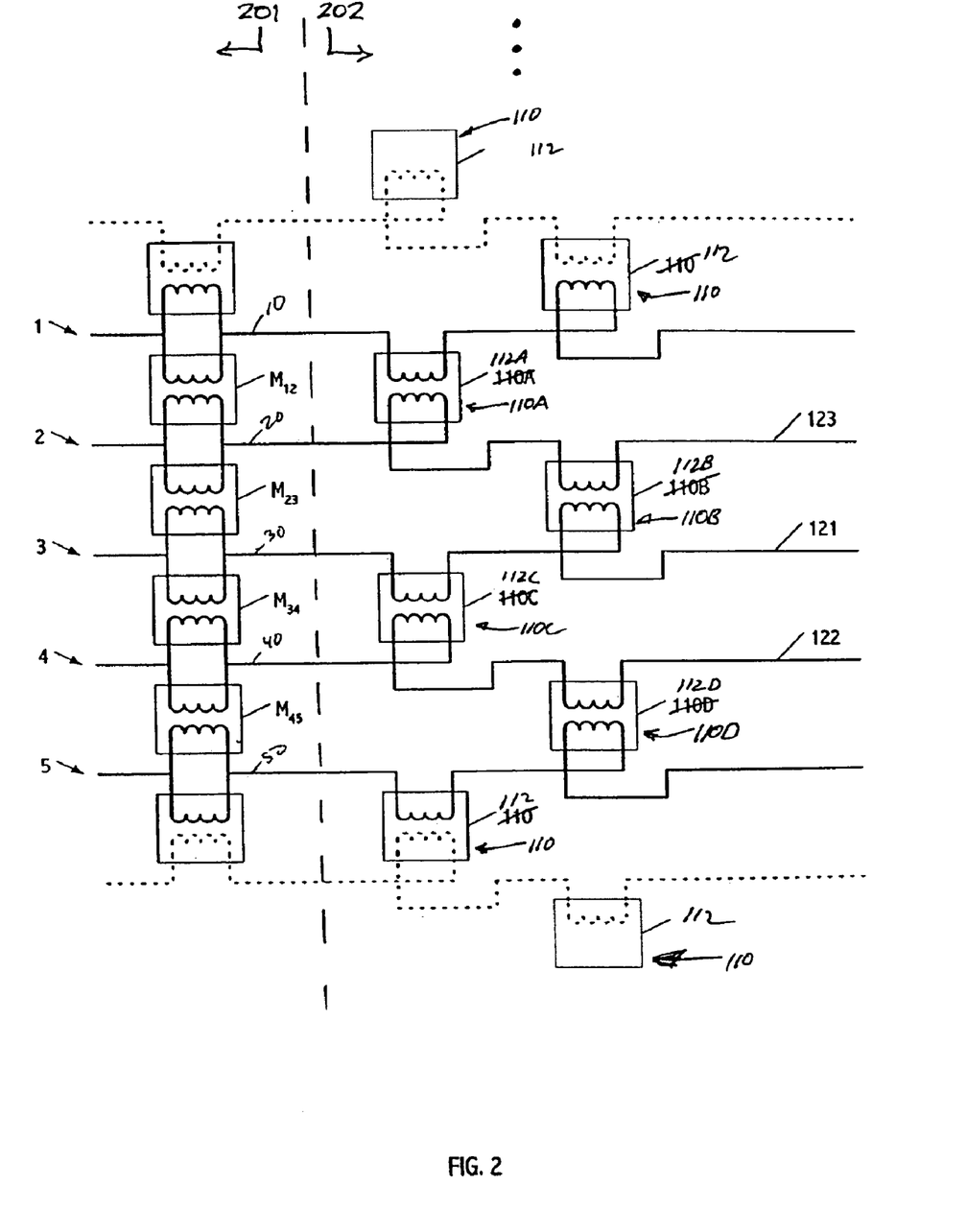
FIG. 2 depicts a circuit representation corresponding to the embodiment of FIG. 1.

FIG. 2 illustrates a circuit diagram corresponding to the crosstalk cancellation configuration of FIG. 1. Coupling between electrical connections 1 and 2 is illustrated as equivalent as transformer $M_{12}$. Similarly, respective couplings between electrical connections 2 and 3, between electrical connections 3 and 4, and between electrical connections 4 and 5 are illustrated as equivalent transformers $M_{23}$, $M_{34}$, and $M_{45}$, respectively. In the illustration of FIG. 2, circuit portion 201 includes off-assembly electrical connections and circuit portion 202 includes on-assembly crosstalk compensation structures such as those as described above.

In general, the illustrated crosstalk compensation technique may be applied to a variety of electrical assembly types, including cards, boards, semiconductor packages, integrated circuit chips, etc. Also in general, the off-assembly electrical connections may include pins, solder balls, leads, or other electrical connections susceptible to inductively coupled crosstalk. Off-assembly electrical connections may, in general, be to a higher-level or lower-level electrical assembly. For example, in an exemplary realization of the illustrated technique on an integrated circuit package, circuit portion 202 is defined on-package to cancel crosstalk induced at off-package connections such as pins, solder balls, leads, etc. to a card, board, or other higher-level package. In an exemplary variation, off-package connections may include electrical connections to a lower-level assembly, e.g., pins, solder balls, leads, etc. to an integrated circuit chip or other lower-level assembly. Realizations of the illustrated technique to other electrical assembly types, e.g., cards, boards, integrated circuit chips, etc. may similarly compensate for crosstalk induced at off-assembly connections to higher-level or to lower-level electrical assemblies.

Some embodiments in accordance with the present invention need not include off-assembly circuit portion 201. For example in some configurations, on-assembly circuit portion 202 is defined to provide crosstalk cancellation once off-assembly electrical connections are defined, formed, or connected thereto. In such a configuration, embodiments in accordance with the present invention are matched to crosstalk characteristics of yet to be formed or connected off-assembly electrical connections.

Figure 3:
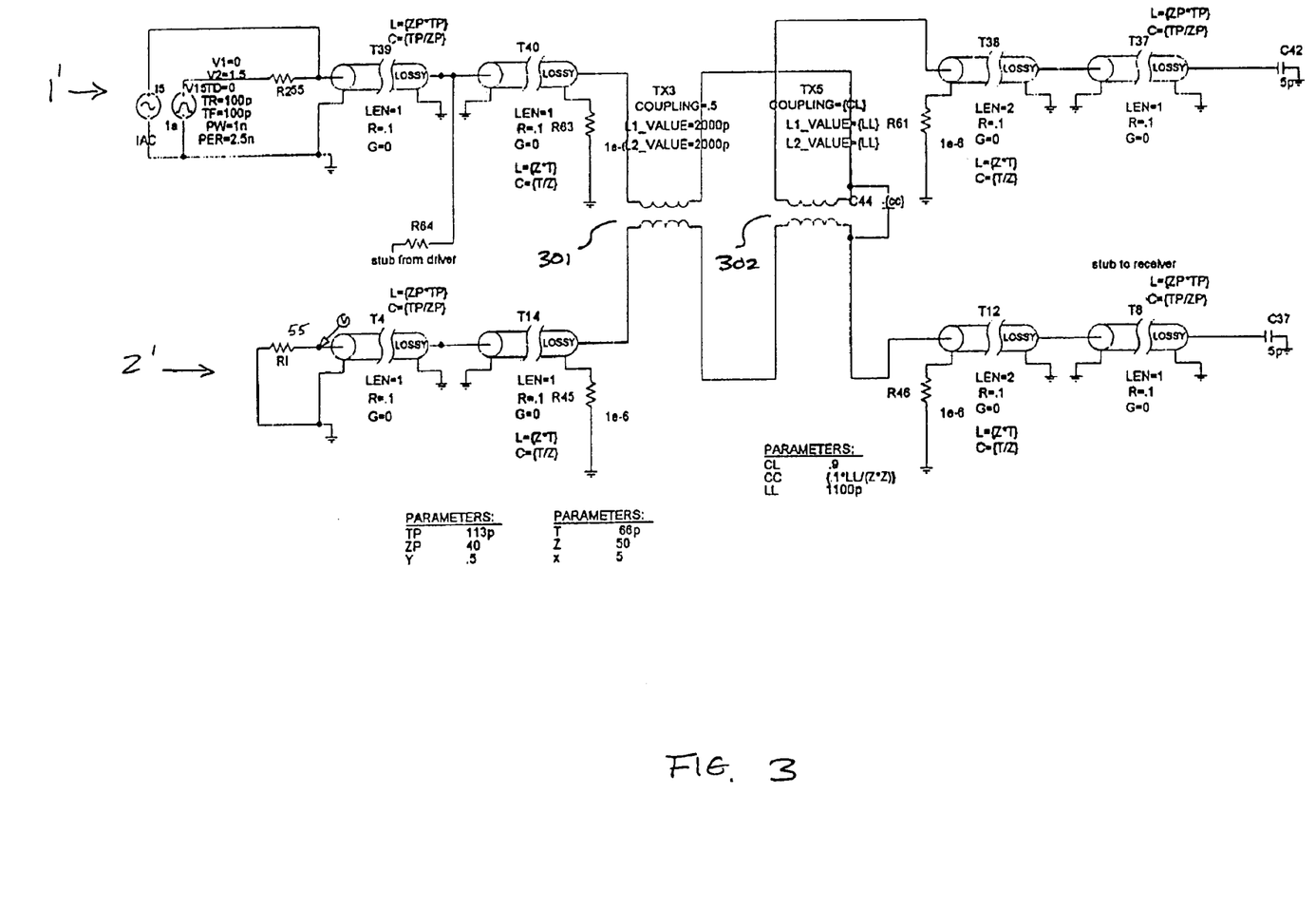
FIG. 3 depicts an electrical simulation model for two inductively coupled electrical connections and a crosstalk cancellation configuration in accordance with the present invention.

FIG. 3 illustrates a circuit model by which advantages of a crosstalk cancellation configuration in accordance with the present invention have been illustrated using simulation. In the illustration of FIG. 3, transformer 301 models the models the mutual inductance between a pair of adjacent off-assembly electrical connections (e.g., between electrical connections 1 and 2 of FIGS. 1 and 2) and transformer 302 models an integrated transformer structure defined on-assembly (e.g., integrated transformer structure 110A). Other aspects of lossy transmission lines are modeled as shown in FIG. 3. When one electrical connection, e.g., electrical connection 1', is driven with a periodic signal, a crosstalk signal will be induced at an adjacent electrical connection, e.g., at electrical connection 2', by virtue of the mutual inductance therebetween, which in the illustration of FIG. 3 is modeled as transformer 301.

Figure 4:
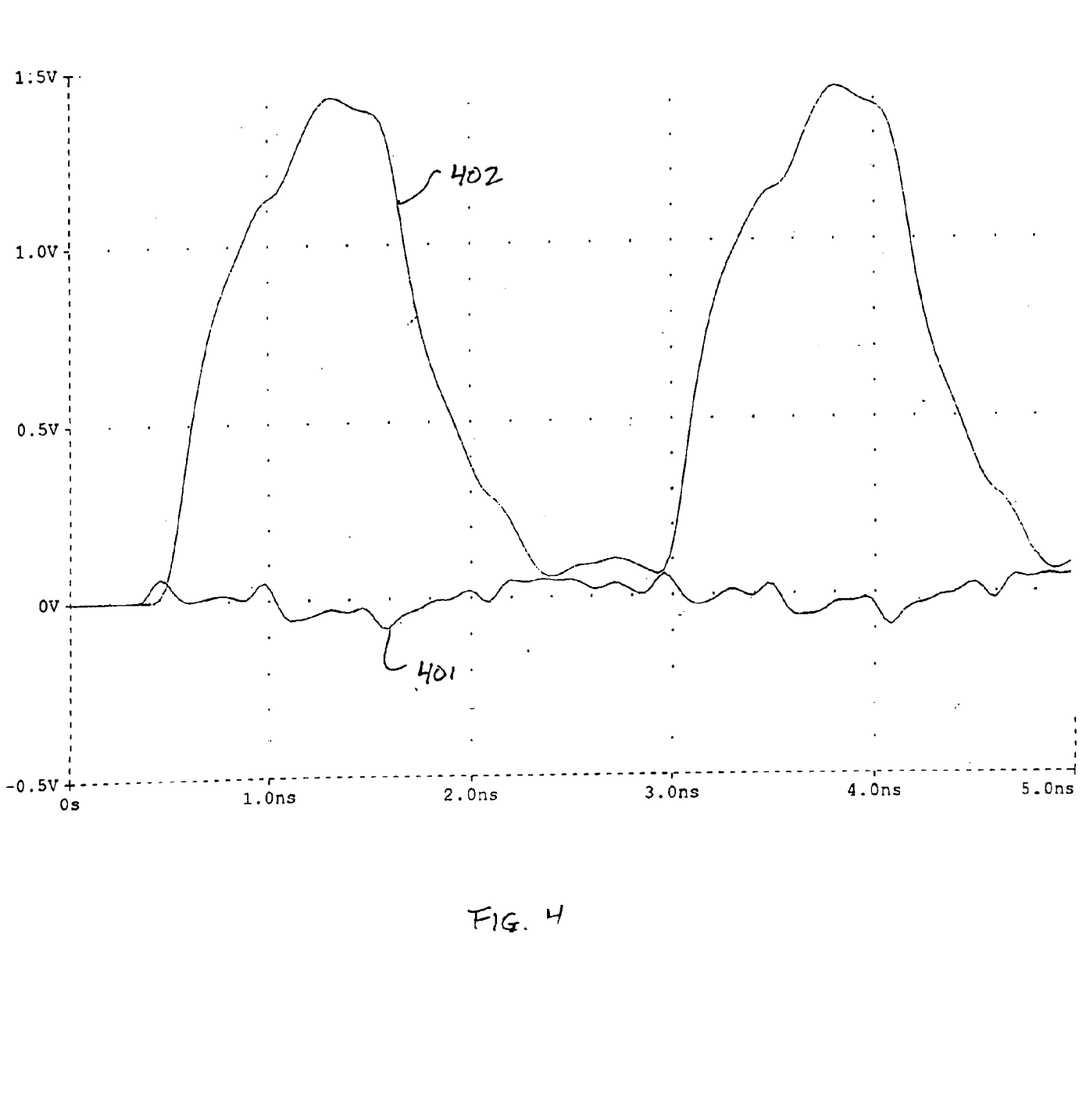
FIG. 4 illustrates coupling of a crosstalk signal from one of the two inductively coupled electrical connections in the simulation model of FIG. 3 to the other without crosstalk cancellation.

FIG. 4 illustrates results of a simulation modeling such crosstalk without benefit of the crosstalk cancellation technique described herein. In particular, FIG. 4 illustrates a crosstalk component 401 impressed on an otherwise quiescent signal by current flow through an adjacent connector corresponding to periodic signal 402. In the context of FIG. 3, periodic signal 402 corresponds to a voltage measured across capacitor C47. The crosstalk component 401 impressed on an otherwise quiescent signal corresponds to a voltage measured across resistance RI. The simulation results presented in FIG. 4 correspond to results of a simulation in which transformer 302 is omitted, i.e., in which on-assembly inductive coupling and associated parasitic capacitance C44 are not included. In this way, the simulation results are illustrative of a configuration without crosstalk cancellation in accordance with the present invention.

Figure 5:
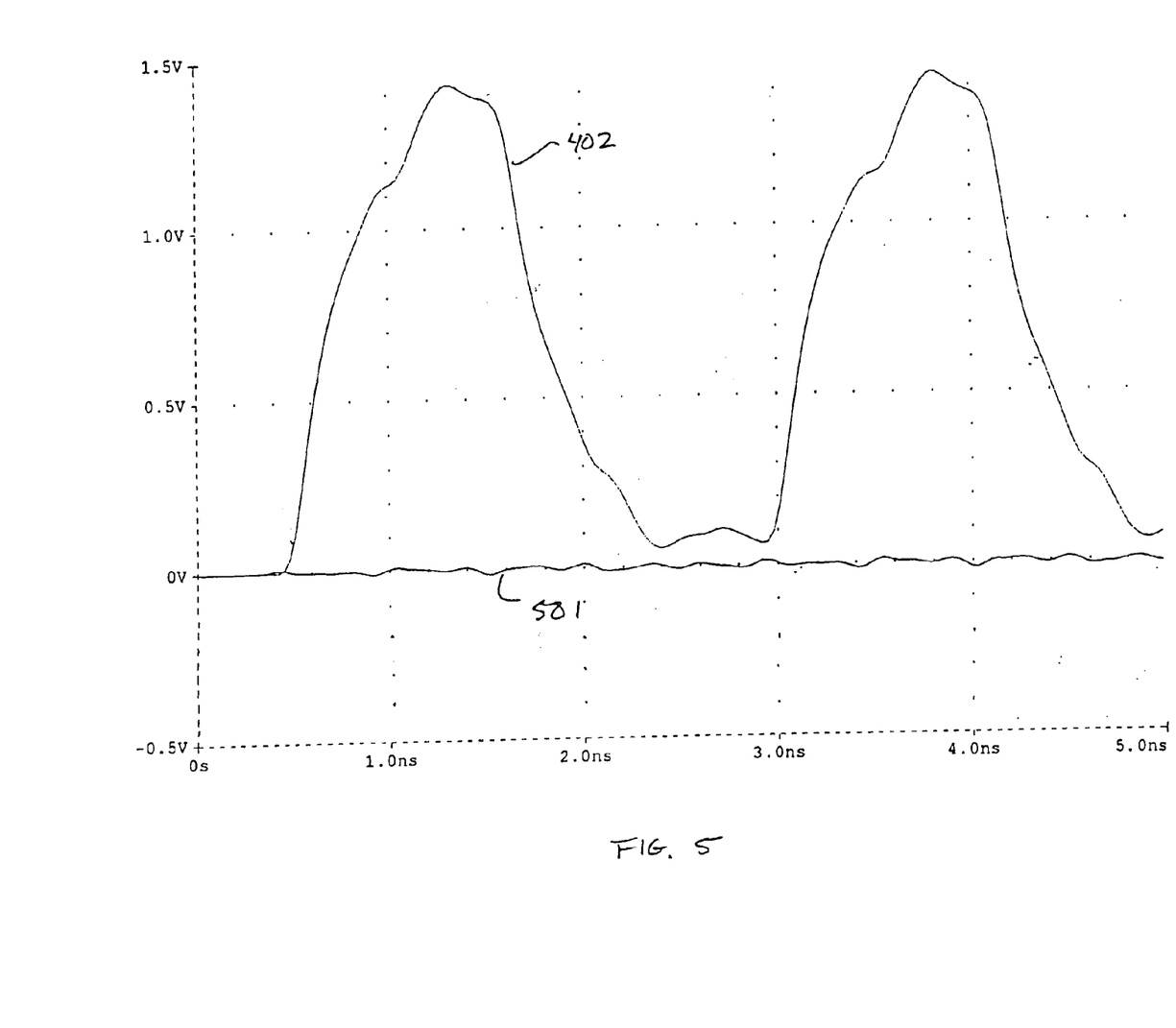
FIG. 5 illustrates cancellation, in accordance with the present invention, of a crosstalk signal induced from one to the other of the two inductively coupled electrical connections in the simulation model of FIG. 3.
Figure 6:
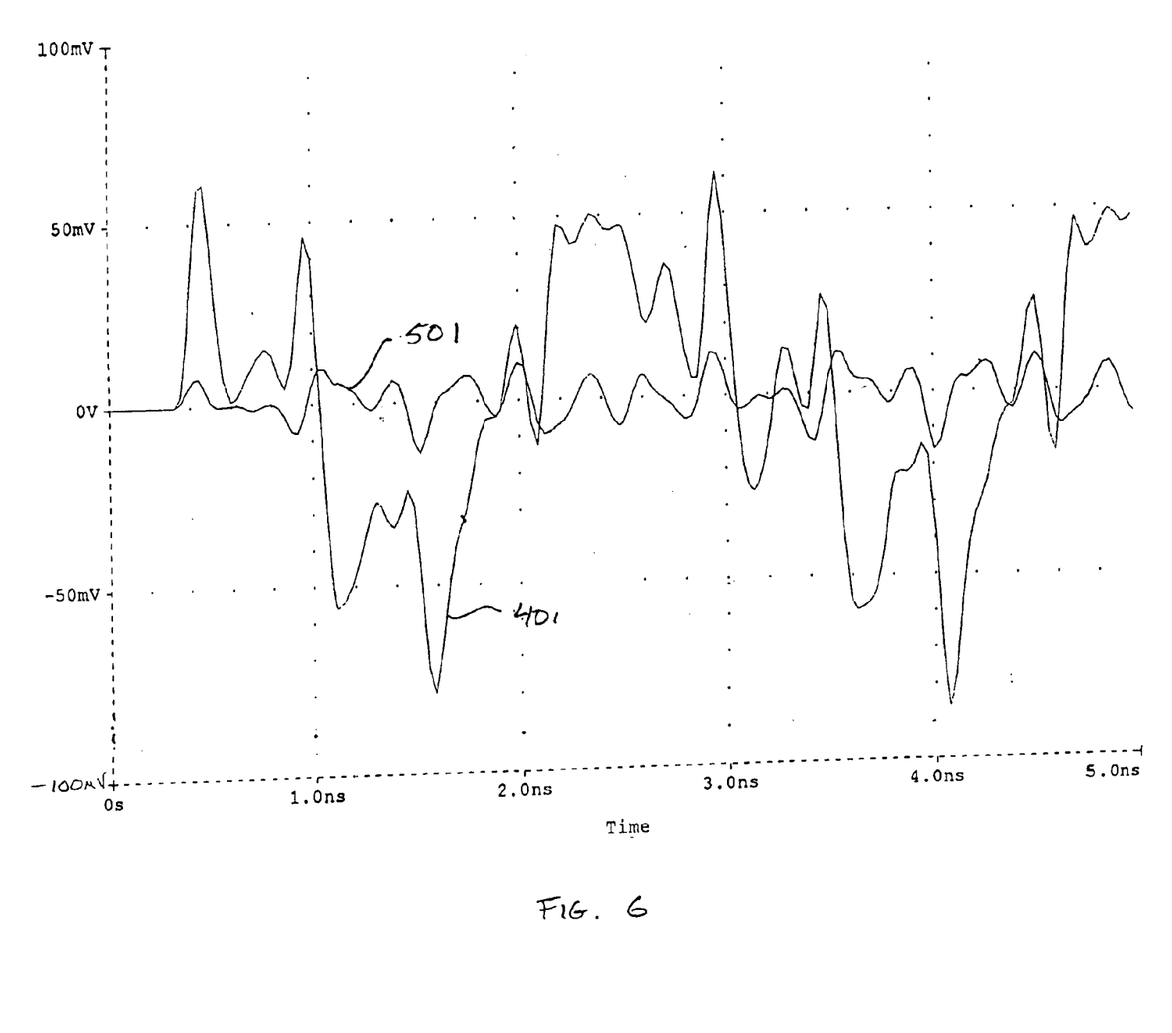

In contrast, FIG. 5 illustrates the efficacy of crosstalk cancellation configurations in accordance with the present invention. In particular, FIG. 5 illustrates a substantially reduced crosstalk component 501 impressed on an otherwise quiescent signal by current flow through an adjacent connector corresponding to periodic signal 402. As before, periodic signal 402 corresponds to a voltage measured across capacitor C42. Also as before, the crosstalk component 501 impressed on an otherwise quiescent signal corresponds to a voltage measured across resistance RI. Simulation results presented in FIG. 4 correspond to results of a simulation in which transformer 302 is included, i.e., in which on-assembly inductive coupling is employed to suppress crosstalk induced at an off-assembly electrical connection 2' by current flow through adjacent off-assembly electrical connection 1'. FIG. 6 overlays a portion of traces 401 and 501 to emphasize the efficacy of crosstalk cancellation configurations in accordance with the present invention. In particular, peak crosstalk induced excursions impressed on the otherwise quiescent signal are reduced from approximately 85 mV to approximately 15 mV.

While the invention has been described with reference to various embodiments, it will be understood that these embodiments are illustrative and that the scope of the invention is not limited to them. Many variations, modifications, additions, and improvements of or to the embodiments described are possible. For example, although simulation results illustrate the efficacy of a crosstalk cancellation configuration suitable to a single isolated pair of electrical connections and associated traces, persons of ordinary skill in the art will recognize that the modeled technique may be applied to configurations wherein crosstalk is induced at a given of assembly electrical connection by more than one adjacent off-assembly electrical connection.

For example, as illustrated in FIGS. 1 and 2, techniques described herein may be applied to configurations, wherein the dominant crosstalk is associated with inductive couplings to two nearest neighbors. One such configuration includes a linear array of off-assembly connections arrayed as peripheral pins on a semiconductor package. Similarly, persons of ordinary skill in the art will appreciate scale-up of the techniques described herein to cancellation of crosstalk induced by larger numbers of off-assembly electrical connections. For example, one such configuration includes a two-dimensional array of off-assembly connections arrayed as solder balls for connecting a semiconductor package to a board or card. In such a configuration, additional stages of integrated on-assembly transformer structures may be defined to provide crosstalk cancellations for signals induced by larger numbers of neighboring off-assembly electrical connections (e.g., for 4 nearest neighboring off-assembly electrical connections in a two-dimensional array of such connections). Note that in such a configuration, on-assembly transformer structures may be defined on the semiconductor package, on the board or card, or on both the semiconductor ° F. package and the board or card.

Configurations are also envisioned wherein crosstalk cancellation may be provided for signals induced by current flows through off-assembly electrical connections beyond those immediately adjacent to a given off-assembly electrical connection. Furthermore, although embodiments have been described primarily in the context of an integrated circuit package and off-package connections (e.g., to a lower-level assembly such as an integrated circuit chip or to a higher-level assembly such as a board or card), exploitation of the techniques described herein is not limited to the integrated circuit package. For example, crosstalk cancellation in accordance with the present invention may be performed at a variety of levels in a hierarchy of electrical assemblies. Based on the description herein, persons of ordinary skill in the art will appreciate suitable variations for other connection technologies and for combinations of connection technologies. These and other variations, modifications, additions, and improvements may fall within the scope of the invention as defined in the claims which follow and will be appreciated by persons of ordinary skill in the art based on the description herein.

What is claimed is:

1. An electrical assembly comprising:
    traces extending toward respective off-assembly connections; and
    structures defined along the traces to induce compensating crosstalk signals having an opposing polarity which opposes initial crosstalk signals that are associated with mutual coupling between adjacent off-assembly connections, wherein one or more of the structures each comprises an aperture in a voltage plane of the electrical assembly and portions of the traces that are essentially parallel to each other and which traverse a respective aperture.

2. The electrical assembly of claim 1, wherein said portions of the traces pass over or under the respective aperture.

3. The electrical assembly of claim 1, wherein the said portions of the traces are coplanar with the voltage plane.

4. The electrical assembly of claim 1, further comprising: the off-assembly connections.

5. The electrical assembly of claim 1, including a semiconductor package,
    wherein the off-assembly connections include pins, solder connections, leads, or wires; and
    wherein the traces are formed on the semiconductor package.

6. The electrical assembly of claim 1, including a board or card,
    wherein the off-assembly connections include pins or leads of a semiconductor package or solder connections or wires thereto; and
    wherein the traces are formed on the board or card.

7. The electrical assembly of claim 1, including a board or card,
    wherein the off-assembly connections include pins, leads, solder connections or edge connectors; and
    wherein the traces are formed on the board or card.

8. The electrical assembly of claim 1, including a semiconductor package, wherein the off-assembly connections include pins, solder connections, leads, or wires.

9. The electrical assembly of claim 1,
    wherein the traces and the off-assembly connections are on opposing sides of the electrical assembly; and
    wherein an electrical connection is provided between a trace and a respective off-assembly connection.

10. The electrical assembly of claim 1,
    wherein the off-assembly connections are organized as an array, and
    wherein said adjacent off-assembly connections are nearest off-assembly connections.

11. The electrical assembly of claim 10,
    wherein the array is linear;
    wherein for each off-assembly connection, there are two nearest off-assembly connections; and
    wherein, for essentially each of the traces, there are two structures defined therealong to induce compensating crosstalk signals to oppose respective initial crosstalk signals introduced by each of said two nearest off-assembly connections.

12. The electrical assembly of claim 1, wherein the off-assembly connections include one of pins, solder joints, leads, and wires.

13. The electrical assembly of claim 1, wherein the electrical assembly includes an integrated circuit chip.

14. The electrical assembly of claim 1, wherein the electrical assembly includes a chip carrier or package.

15. The electrical assembly of claim 1, wherein the electrical assembly includes a board or card.

16. An electrical assembly comprising:
    at least a portion of a crosstalk compensation circuit defined thereon for offsetting an, original crosstalk signal induced at a first off-assembly connection by one or more signals on one or more adjacent off-assembly connections; and
    electrical traces traversing apertures defined in one or more voltage planes of the assembly to inductively couple compensating crosstalk signals having opposing polarity to the original crosstalk signal.

17. The electrical assembly of claim 16, wherein the electrical traces are respectively coupled to the first and adjacent connections.

18. An electrical assembly comprising:
    traces extending toward respective off-assembly connections; and
    means defined alone the traces for inducing compensating crosstalk signals having opposing polarity to initial crosstalk signals associated with mutual coupling between adjacent of the off-assembly connections, the means for inducing compensating crosstalk signals including;

an aperture in a voltage plane of the electrical assembly; and essentially parallel portions of a corresponding pair of the traces, the essentially parallel portions coplanar with the voltage plane and traversing the aperture therein.

19. The electrical assembly of claim 18, wherein the means for inducing compensating crosstalk signals include inductive structures defined along the traces.

20. The electrical assembly of claim 18, wherein the means for inducing compensating crosstalk signals define at least a portion of a crosstalk compensation circuit.

21. An electrical assembly comprising:

traces extending toward respective off-assembly connections; and essentially parallel portions of the traces traversing apertures defined in one or more voltage planes of the assembly to inductively couple compensating crosstalk signals having opposing polarity to an original crosstalk signal.

22. The electrical assembly of claim 21, wherein the aperture traversing portions of the traces at least partially define integrated, coplanar inductive structures.

* * * * *

UNITED STATES PATENT AND TRADEMARK OFFICE
CERTIFICATE OF CORRECTION

PATENT NO. : 6,891,731 B1
DATED : May 10, 2005
INVENTOR(S) : Dennis James Herrell It is certified that error appears in the above-identified patent and that said Letters Patent is hereby corrected as shown below:

Column 3,
Lines 9-12, "FIG. 6 overlays the uncancelled signal of FIG. 4 and the cancelled signal of FIG. 5 to emphasize the efficacy of the crosstalk cancellation technique" should read -- FIG. 6 overlays the uncancelled signal of FIG. 4 and the cancelled signal of FIG. 5 to emphasize the efficacy of the crosstalk cancellation technique. --.

Column 4,
Line 21, the words "illustrated in FIG. 1." should read -- illustrated in FIG. 1, --.

Column 8,
Line 48, the words "offsetting an, original" should read -- offsetting an original --.
Line 62, the word "alone" should read -- along --.
Line 67, the word "including;" should read -- including: --.

Signed and Sealed this

Sixteenth Day of August, 2005

JON W. DUDAS
*Director of the United States Patent and Trademark Office*